United States Patent
Hsiao et al.

(10) Patent No.: US 9,246,002 B2
(45) Date of Patent: Jan. 26, 2016

(54) STRUCTURE AND METHOD FOR SEMICONDUCTOR DEVICE

(71) Applicant: Taiwan Semiconductor Manufacturing Company, Ltd., Hsin-Chu (TW)

(72) Inventors: Ru-Shang Hsiao, Hsinchu County (TW); Ling-Sung Wang, Tainan (TW); Chih-Mu Huang, Tainan (TW); Chih-Kang Chao, Tainan (TW); Chen-Chieh Chiang, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/208,294

(22) Filed: Mar. 13, 2014

(65) Prior Publication Data
US 2015/0263168 A1    Sep. 17, 2015

(51) Int. Cl.
*H01L 21/338* (2006.01)
*H01L 29/78* (2006.01)
*H01L 29/66* (2006.01)
*H01L 29/10* (2006.01)

(52) U.S. Cl.
CPC ........ *H01L 29/7833* (2013.01); *H01L 29/1054* (2013.01); *H01L 29/66492* (2013.01); *H01L 29/66545* (2013.01)

(58) Field of Classification Search
CPC ................. H01L 21/26513; H01L 29/7833; H01L 29/1054
USPC ........................... 438/401, 478, 183
See application file for complete search history.

(56) References Cited

U.S. PATENT DOCUMENTS

| | | | |
|---|---|---|---|
| 6,368,925 B2 | 4/2002 | Weon et al. | |
| 6,949,796 B1 | 9/2005 | Ellis-Monaghan et al. | |
| 7,985,985 B2 | 7/2011 | Hokazono | |
| 8,154,077 B2 | 4/2012 | Miyata | |
| 8,586,436 B2 | 11/2013 | Ng et al. | |
| 8,836,018 B2 * | 9/2014 | Yang et al. | 257/329 |
| 2014/0252504 A1 * | 9/2014 | Chuang et al. | 257/412 |

* cited by examiner

*Primary Examiner* — Bradley K Smith
(74) *Attorney, Agent, or Firm* — Haynes and Boone, LLP

(57) ABSTRACT

A semiconductor device and a method of forming the same are disclosed. The semiconductor device includes a substrate, and a source region and a drain region formed in the substrate. The semiconductor device further includes an impurity diffusion stop layer formed in a recess of the substrate between the source region and the drain region, wherein the impurity diffusion stop layer covers bottom and sidewalls of the recess. The semiconductor device further includes a channel layer formed over the impurity diffusion stop layer and in the recess, and a gate stack formed over the channel layer. The impurity diffusion stop layer substantially prevents impurities of the substrate and the source and drain regions from diffusing into the channel layer.

20 Claims, 13 Drawing Sheets

STRUCTURE AND METHOD FOR SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, carrier mobility is an important concern for the performance of a transistor, such as a metal oxide field effect transistor (MOSFET). With its decreased size, a transistor also has a decreased channel length, making it easier for impurities from source and drain regions of the transistor to diffuse into its channel region. Such impurities consequently reduce mobility of the carriers within the channel region. This is particularly troublesome with p-type MOSFETs where boron is usually the dopant in the source and drain regions because boron has a lower atomic weight and longer diffusing length than other commonly used dopants, such as phosphorus, in n-type MOSFETs. Furthermore, it has been observed that there are higher variations in ion implantation depth with smaller transistors. This contributes to higher variations in both carrier mobility and threshold voltage (Vt) of such transistors, adversely affecting their performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
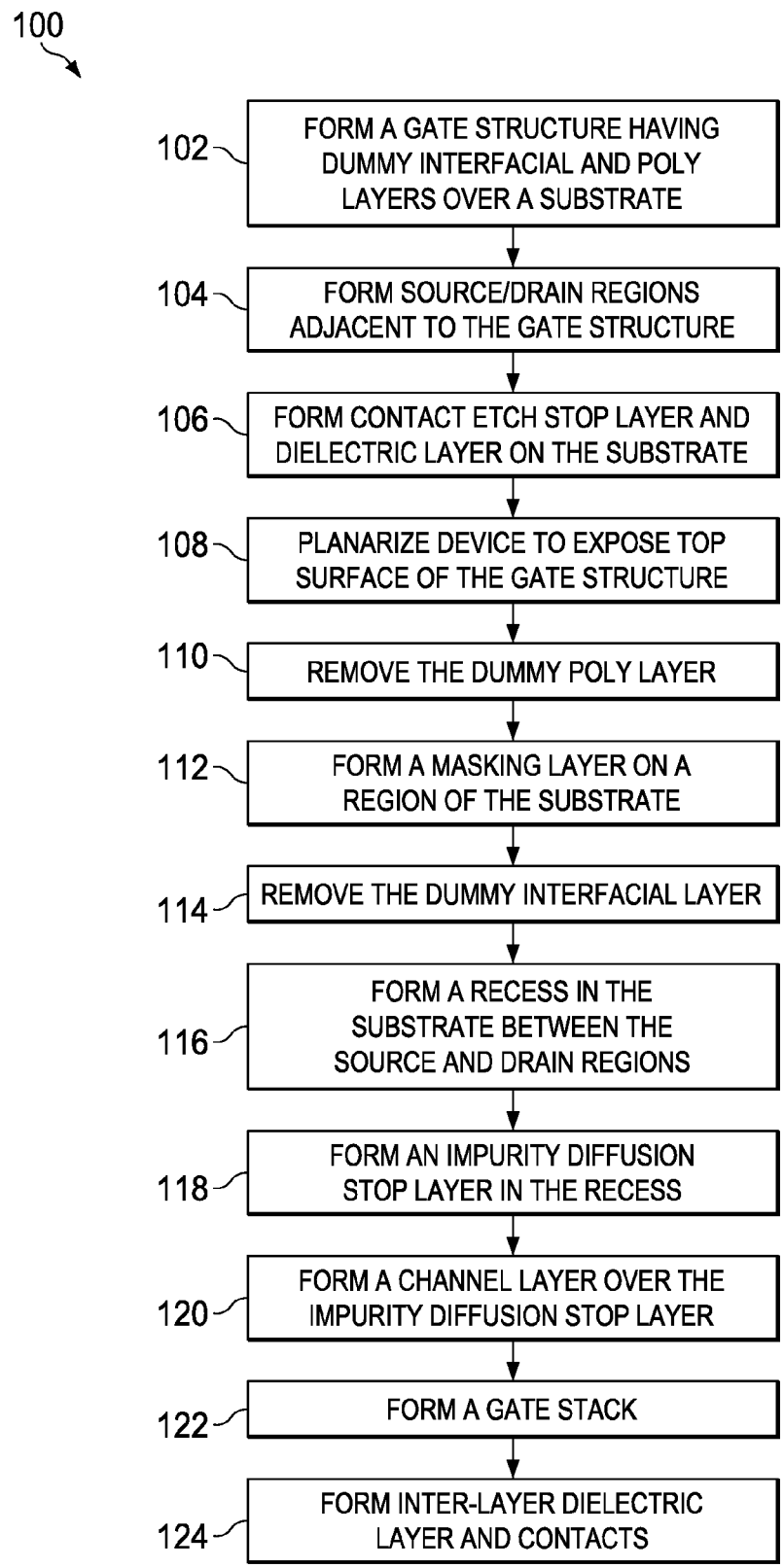
FIG. 1 is a block diagram of a method of forming a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, shown therein is a method 100 of forming a semiconductor device according to various aspects of the present disclosure. One goal of some embodiments of the method 100 is that the device thus formed will have a channel that is substantially free from impurities and that the impurities from the source and drain regions of the device will be substantially blocked from diffusing into the channel. This will effectively improve the semiconductor device's carrier mobility and threshold voltage (Vt) uniformity, which has become an important factor in advanced processes, such as 20 nanometer (nm) and smaller. The method 100 is an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 3-13 which are cross-sectional views of a device 200 according to various aspects of the present disclosure.

As will be shown, the device 200 illustrates a p-type field effect transistor (PFET) in one region of a substrate. This is provided for simplification and ease of understanding and does not necessarily limit the embodiment to any number of devices, any number of regions, or any configuration of structures of regions. Furthermore, the device 200 may be an intermediate device fabricated during processing of an IC, or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2:
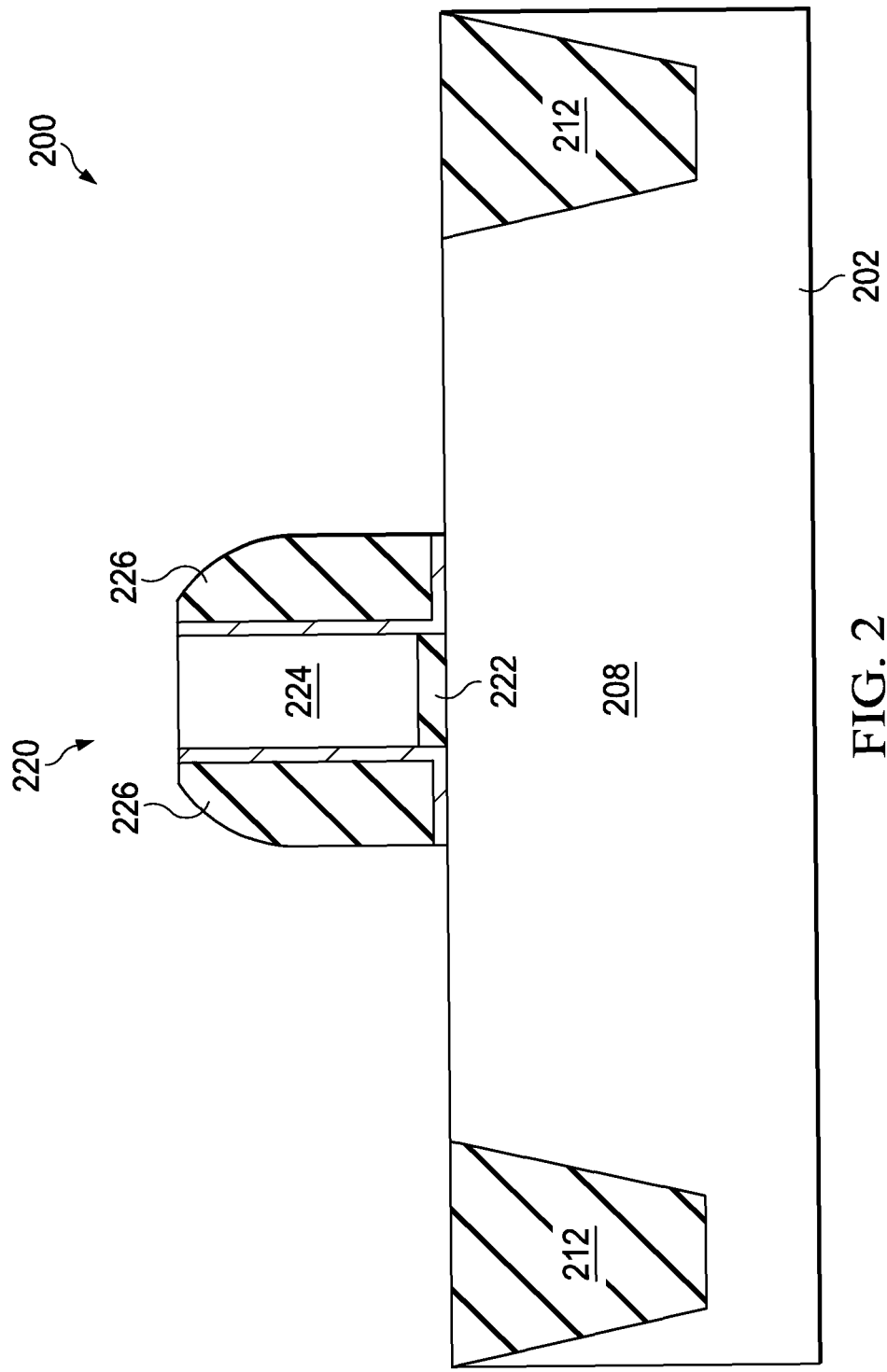
FIGS. 2-13 illustrate cross sectional views of forming a target semiconductor device according to the method of FIG. 1, in accordance with an embodiment.

The method 100 (FIG. 1) forms a gate structure 220 over a substrate 202 (FIG. 2) at operation 102. Referring to FIG. 2, the substrate 202 is a silicon substrate in the present embodiment. Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor on insulator (SOI).

The substrate 202 includes a region 208 that is isolated from other portions of the substrate 202 by isolation structures 212. In the present embodiment, the region 208 is a p-type field effect transistor region, such as an n-well in a p-type substrate, for forming a PFET. In another embodiment, the region 208 is an n-type field effect transistor region for forming an NFET.

The isolation structures 212 may be formed of silicon oxide, silicon nitride, silicon oxynitride, fluoride-doped silicate glass (FSG), a low-k dielectric material, and/or other suitable insulating material. The isolation structures 212 may be shallow trench isolation (STI) features. In an embodiment, the isolation structures 212 are STI features and are formed by etching trenches in the substrate 202. The trenches may then be filled with isolating material, followed by a chemical mechanical planarization (CMP). Other isolation structures 212 such as field oxide, LOCal Oxidation of Silicon (LOCOS), and/or other suitable structures are possible. The isolation structures 212 may include a multi-layer structure, for example, having one or more liner layers.

The gate structure 220 includes a gate stack that includes an interfacial layer 222 and a polysilicon (or poly) layer 224. In the present embodiment, the interfacial layer 222 and the poly layer 224 will be removed in later operations. Therefore, they are also referred to as the dummy interfacial layer 222 and the dummy poly layer 224 respectively. In an embodiment, the gate structure 220 further includes a gate dielectric layer and a metal gate layer disposed between the interfacial layer dummy 222 and the dummy poly layer 224. The dummy interfacial layer 222 may include a dielectric material such as silicon oxide layer ($SiO_2$) or silicon oxynitride (SiON). The dummy interfacial layer 222 may be formed by chemical oxidation, thermal oxidation, atomic layer deposition (ALD), chemical vapor deposition (CVD), and/or other suitable methods. The dummy poly layer 224 may be formed by suitable deposition processes such as low-pressure chemical vapor deposition (LPCVD) and plasma-enhanced CVD (PECVD). In an embodiment, a hard mask layer is disposed on the gate structure 220 and the hard mask layer may include one or more layers of material such as silicon oxide and/or silicon nitride.

The gate structure 220 further includes gate spacers 226 positioned along sidewalls of the gate stack, specifically along sidewalls of the dummy interfacial layer 222 and the dummy poly layer 224. The gate spacers 226 include a dielectric material, such as silicon oxide, silicon nitride, silicon oxynitride, other dielectric material, or combination thereof. In an example, the gate spacers 226 are formed by blanket depositing a first dielectric layer (e.g., a silicon oxide layer having a uniform thickness) as a liner layer over the device 200 and a second dielectric layer (e.g., a silicon nitride layer) as a main D-shaped spacer over the first dielectric layer, and then, anisotropically etching to remove portions of the dielectric layers to form the gate spacers 226 as illustrated in FIG. 2. In some embodiments, the gate structure 220 may include a seal layer between the gate stack 222/224 and the spacers 226.

Figure 3:
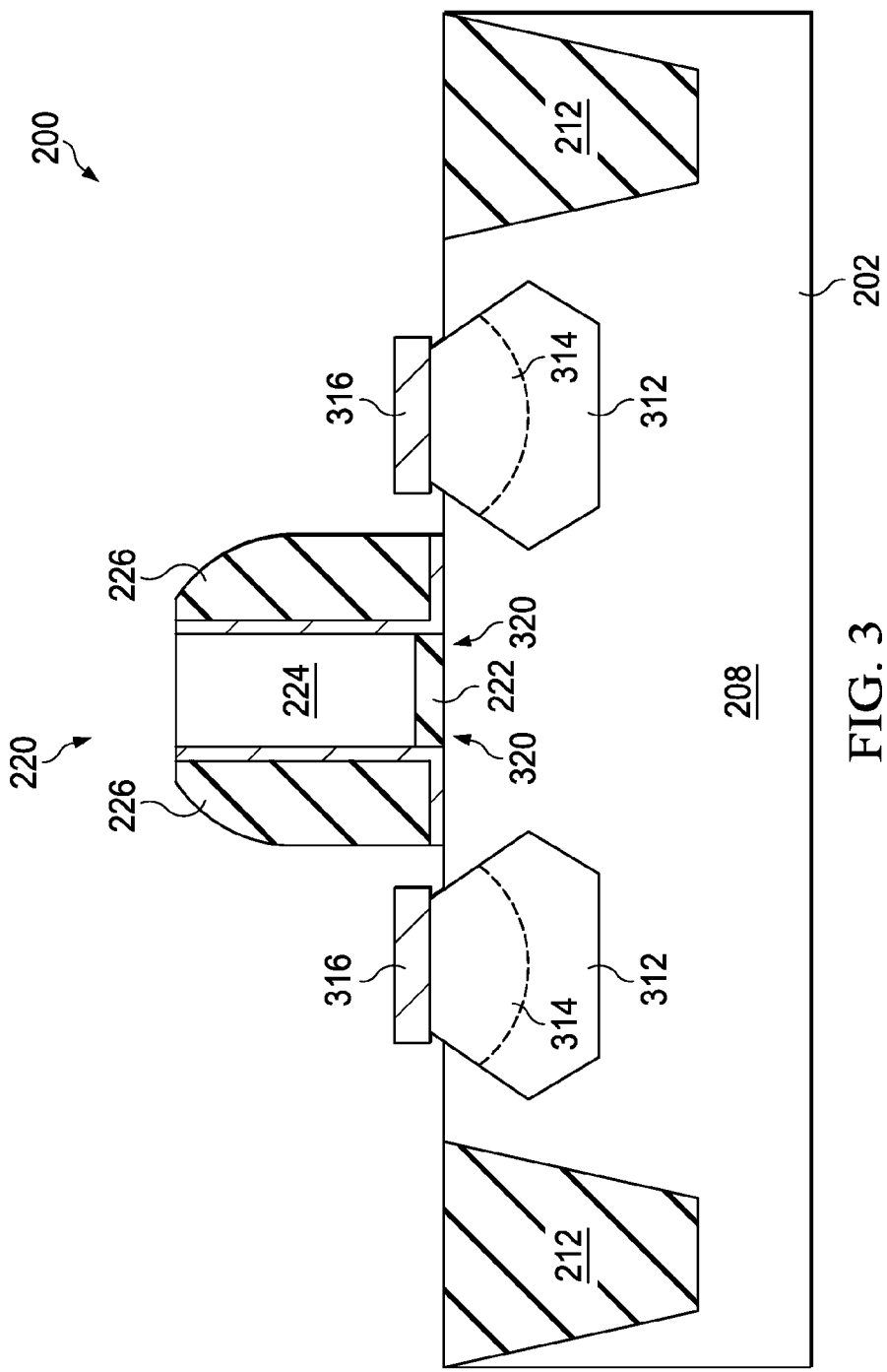

The method 100 (FIG. 1) proceeds to operation 104 to form source and drain regions in the substrate 202 adjacent to the gate structure 220. Referring to FIG. 3, in the present embodiment, the source and drain regions each includes a lightly doped source/drain (LDD) 312, a heavily doped source/drain (HDD) 314, and a silicidation 316.

In the present embodiment, the LDD 312 is formed by a process that includes an etching process, a cleaning process, and an epitaxy process. For example, the etching process removes portions of the substrate 202 adjacent to the gate structure 220 thereby forming two recesses sandwiching the gate structure 220; the cleaning process clean the recesses with a hydrofluoric acid (HF) solution or other suitable solution; and the epitaxy process performs a selective epitaxial growth (SEG) process thereby forming an epitaxial layer 312 in the recesses. The etching process may be a dry etching process, a wet etching process, or a combination thereof. In an embodiment, the SEG process is a low pressure chemical vapor deposition (LPCVD) process using a silicon-based precursor gas. Further, in the present example, the SEG process in-situ dopes the epitaxial layer 312 with a p-type dopant for forming a PFET. For example, the SEG process may use boron-containing gases such as diborane ($B_2H_6$), other p-type dopant-containing gases, or a combination thereof. If the epitaxial layer 312 is not doped during the SEG process, it may be doped in a subsequent process, for example, by an ion implantation process, plasma immersion ion implantation (PIII) process, gas and/or solid source diffusion process, other process, or a combination thereof. An annealing process, such as a rapid thermal annealing and/or a laser thermal annealing, may be performed to activate dopants in the epitaxial layer 312.

In the present embodiment, the HDD 314 may be formed by a process that includes an etch-back process and an epitaxy process. For example, the etch-back process selectively etches the epitaxial layer 312 to remove portions thereof with a dry etching process, a wet etching process, or combination thereof; and the epitaxy process uses a process similar to that forms the LDD 312 but using heavier p-type dopants. An annealing process, such as a rapid thermal annealing and/or a laser thermal annealing, may be performed to activate dopants in the epitaxial layer 314.

In the present embodiment, the silicidation 316 may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicidation 316 may be formed by a process that includes depositing a metal layer, annealing the metal layer such that the metal layer is able to react with silicon to form silicide, and then removing the non-reacted metal layer.

The structure and formation of the source/drain regions 312/314/316 discussed above is merely an example, and is not intended to limit the present disclosure beyond what is explicitly recited in the claims. In various embodiments of the present disclosure, the source/drain regions may be formed by a variety of other processes. For example, the source/drain regions may be formed by a halo or lightly doped drain (LDD) implantation, source/drain implantation, source/drain activation and/or other suitable processes.

FIG. 3 also illustrates a channel region 320 of the substrate 202 that is underneath the gate structure 220 and between the source and drain regions 312/314/316 along the gate length direction of the PFET 200. The channel region 320 will form a conductive channel for the PFET 200 between the source and drain regions 312/314/316 when proper voltages are applied to the PFET 200. With the semiconductor process technology advances to nanometer regime, such as 20 nm or smaller, carrier mobility in the channel region 320 is highly affected by impurities therein. Impurities may come from the region 208 that includes n-dopants, or from the doped source/drain regions 312/314 that include p-dopants. For example, both the LDD 312 and the HDD 314 may include boron as a dopant. With its low atomic weight, boron atoms may diffuse a great length out of the doped regions 312/314 and into the channel region 320. Some embodiments of the present disclosure seek to solve such a problem by forming an impurity diffusion stop layer that isolates the channel region 320 from the doped source/drain regions 312/314 and the doped region 208. The impurity diffusion stop layer will substantially prevent impurities such as boron atoms from diffusing into the channel region 320, while still allow charge carriers such as electrons or holes to flow between the source/drain regions 312/314/316 for conducting the functions of the PFET 200.

Even though the discussion above uses PFETs as an example, similar impurity diffusion issues exist with NFETs and can be similarly solved by various embodiments of the present disclosure. In some embodiments of the present disclosure, the device 200 is a NFET, the region 208 includes p-type dopant, and the source/drain regions 312/314 include n-type dopants such as phosphorous.

Figure 4:
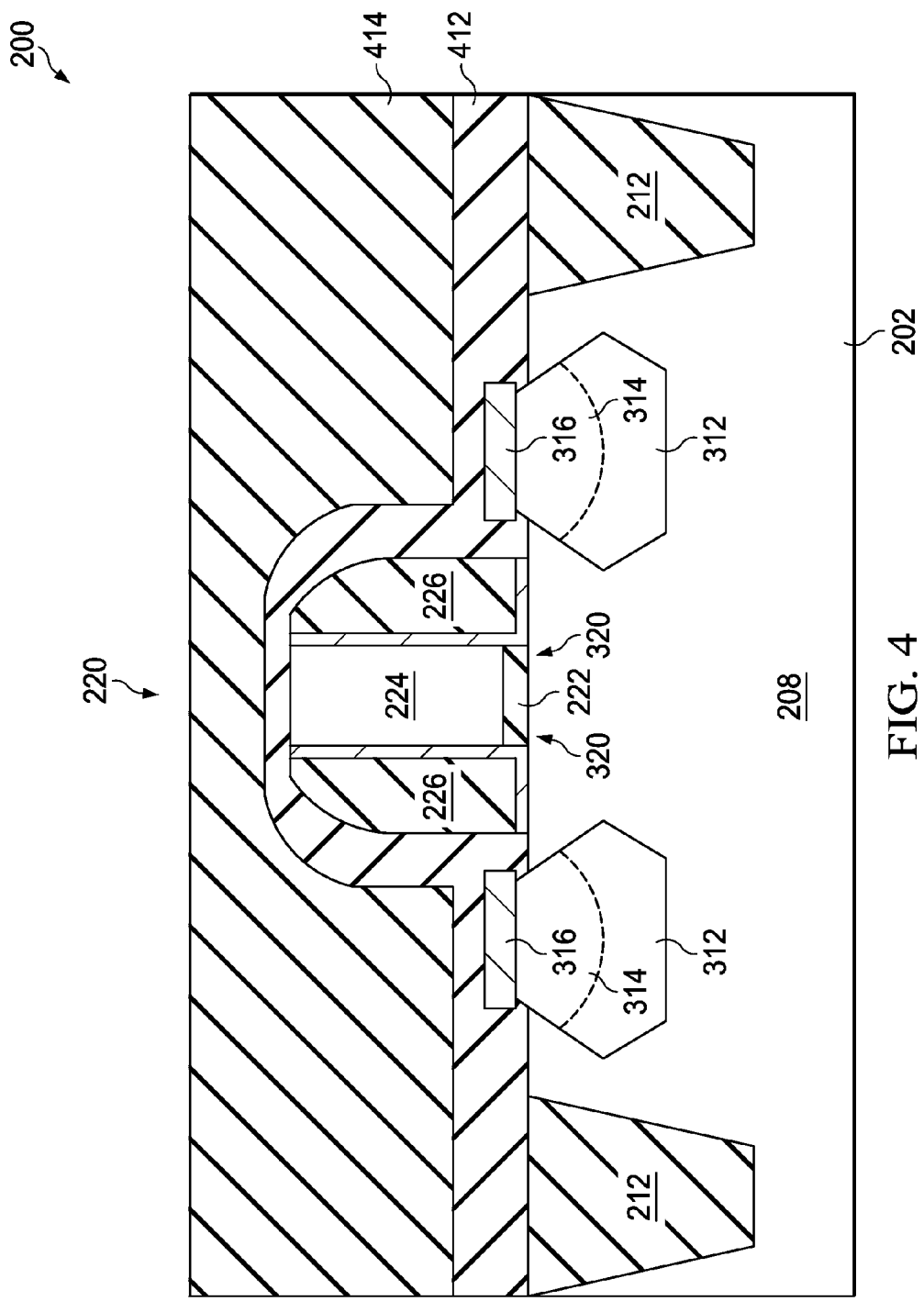

The method 100 (FIG. 1) proceeds to operation 106 to form a contact etch stop layer (CESL) 412 and a dielectric layer 414 over the gate structure 220 and over the substrate 202 (FIG. 4). Examples of materials that may be used to form the CESL 412 include silicon nitride, silicon oxide, silicon oxynitride, and/or other materials. The CESL 412 may be formed by PECVD process and/or other suitable deposition or oxidation processes. The dielectric layer 414 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 414 may be deposited by a PECVD process or other suitable deposition technique. In an embodiment, prior to the formation of the CESL 412 and the dielectric layer 414, a partial removal of the spacers 226 may be performed to reduce the thickness thereof.

Figure 5:
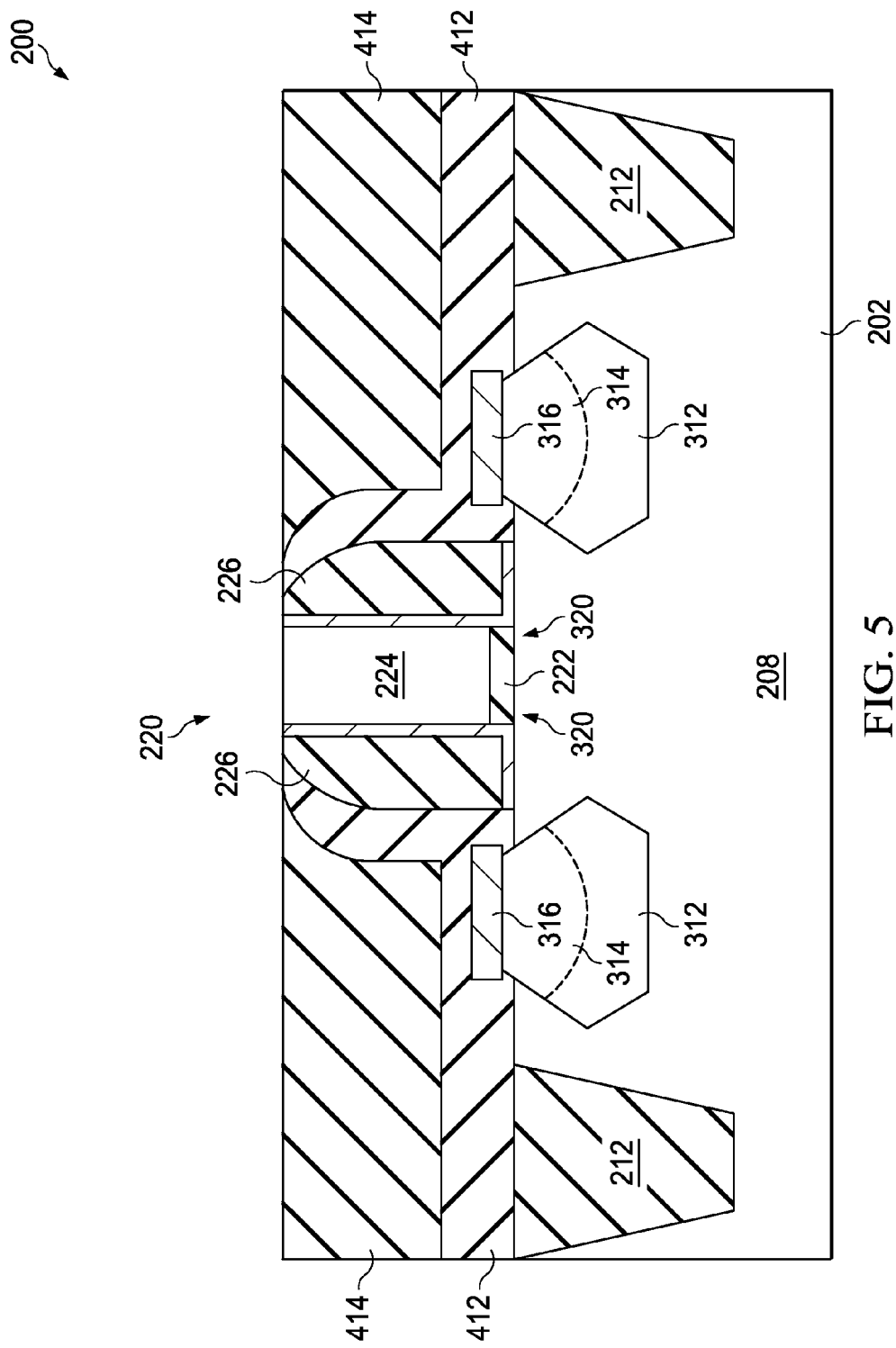

The method 100 (FIG. 1) proceeds to operation 108 to planarize the contact etch stop layer (CESL) 412 and the dielectric layer 414 to expose a top surface of the gate structure 220. Referring to FIG. 5, the dummy poly layer 224 is exposed by operation 108. In an embodiment, the planarization process uses a chemical mechanical planarization (CMP).

Figure 6:
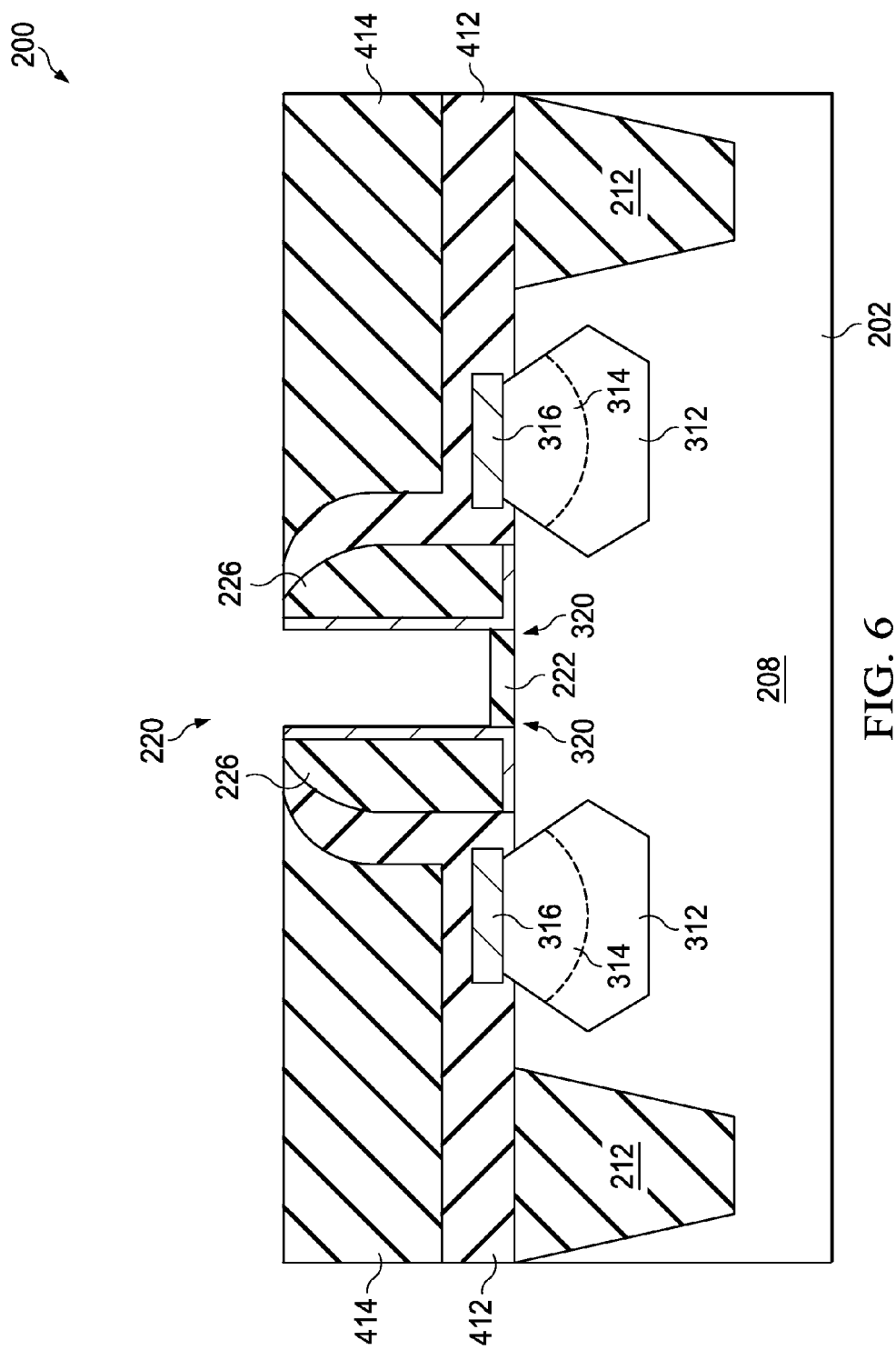

The method 100 (FIG. 1) proceeds to operation 110 to remove the dummy poly layer 224 from the gate structure 220. The dummy poly layer 224 can be removed with a suitable wet etch, dry (plasma) etch, and/or other processes that is selectively tuned to remove the polysilicon material. Referring to FIG. 6, in the present embodiment, the dummy poly layer 224 and any other layer(s) (not shown) are removed thereby exposing the dummy interfacial layer 222. In some embodiments, certain regions of the IC may be covered by a hard mask layer so that poly layers in those regions are protected from the etching process while the dummy poly layers in the region 208, such as the dummy poly layer 224, are removed.

Figure 7:
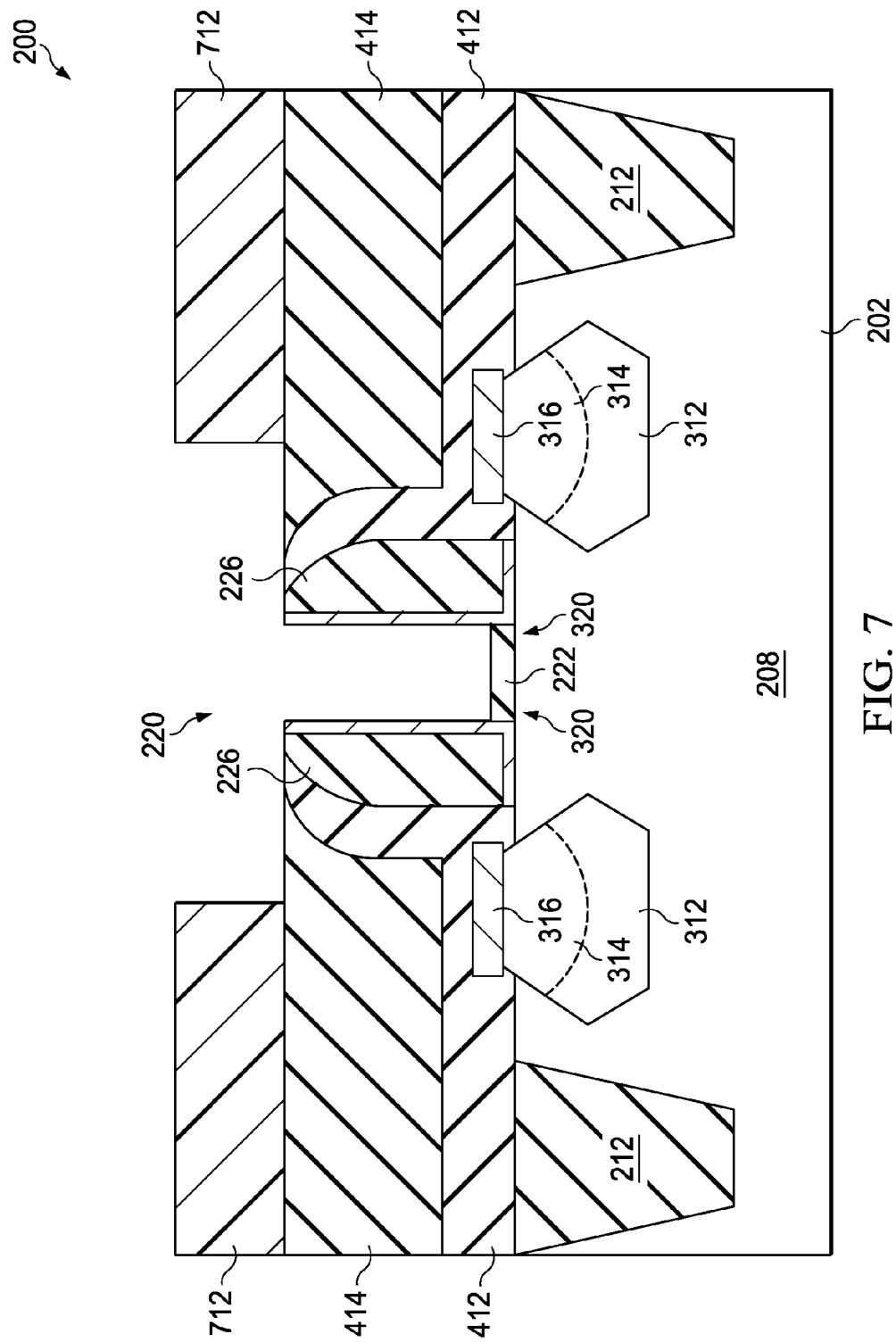
Figure 8:
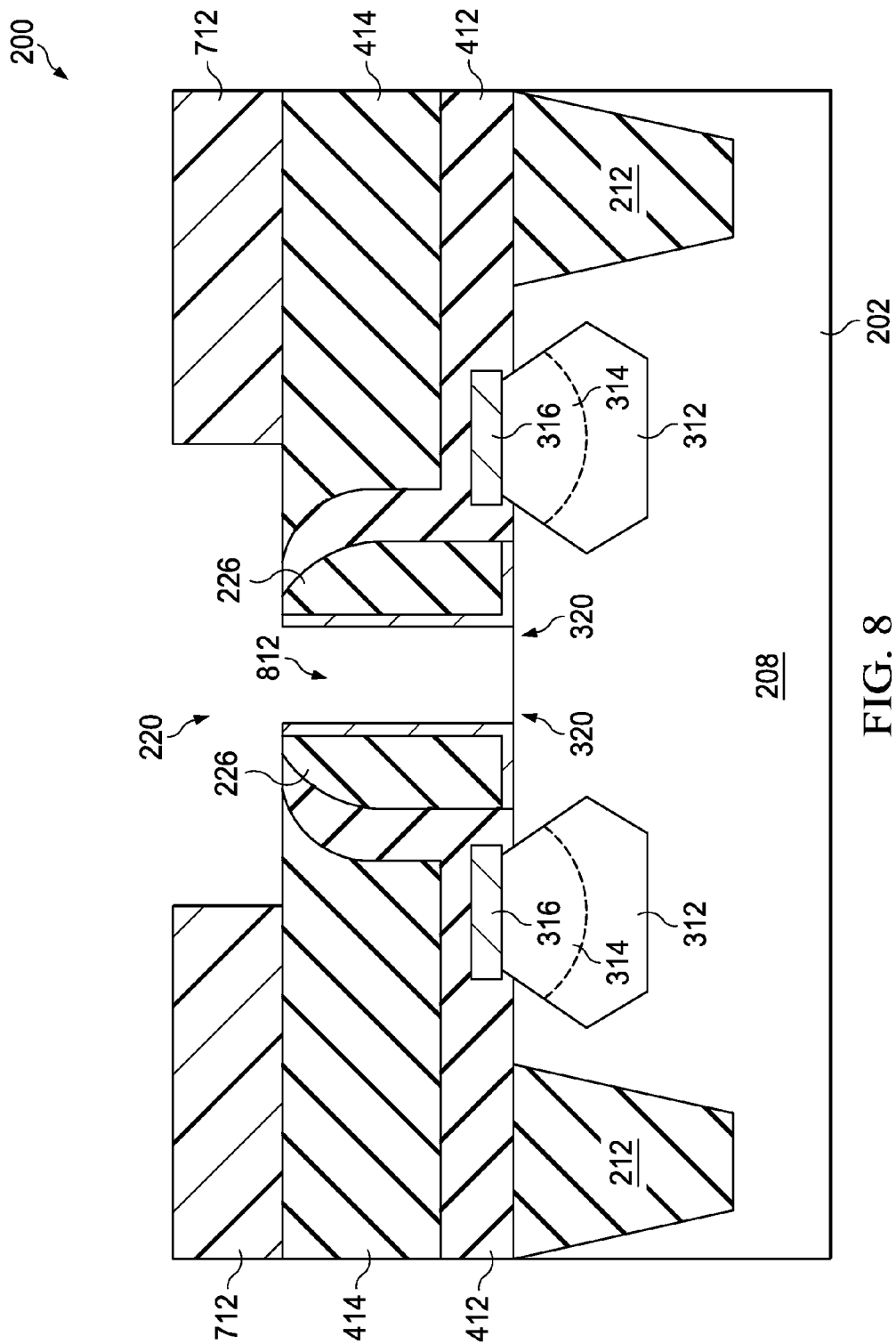

The method 100 (FIG. 1) proceeds to operation 112 to form a masking element 712 over the dielectric layer 414. Referring to FIG. 7, in an embodiment, the masking element 712 may be formed using a photolithography patterning process. A typical photolithography patterning process includes coating a resist layer over the dielectric layer 414, soft baking the resist layer, and exposing the resist layer to a radiation using a mask. The process further includes post-exposure baking, developing, and hard baking thereby removing portions of the resist layer and leaving a patterned resist layer as the masking element 712. In the present embodiment, the masking element 712 has an opening through which the dummy interfacial layer 222 can be etched.

The method 100 (FIG. 1) proceeds to operation 114 to remove the dummy interfacial layer 222. The dummy interfacial layer 222 may be removed using a suitable wet etch process, dry (plasma) etch process, and/or other processes. For example, a dry etching process may use chlorine-containing gases, fluorine-containing gases, other etching gases, or a combination thereof. The wet etching solutions may include $NH_4OH$, HF (hydrofluoric acid), TMAH (tetramethylammonium hydroxide), other suitable wet etching solutions, or combinations thereof. After the dummy interfacial layer 222 has been removed, an opening 812 is formed in the gate structure 220 (FIG. 8), through which the channel region 320 of the substrate 202 can be etched.

Figure 9:
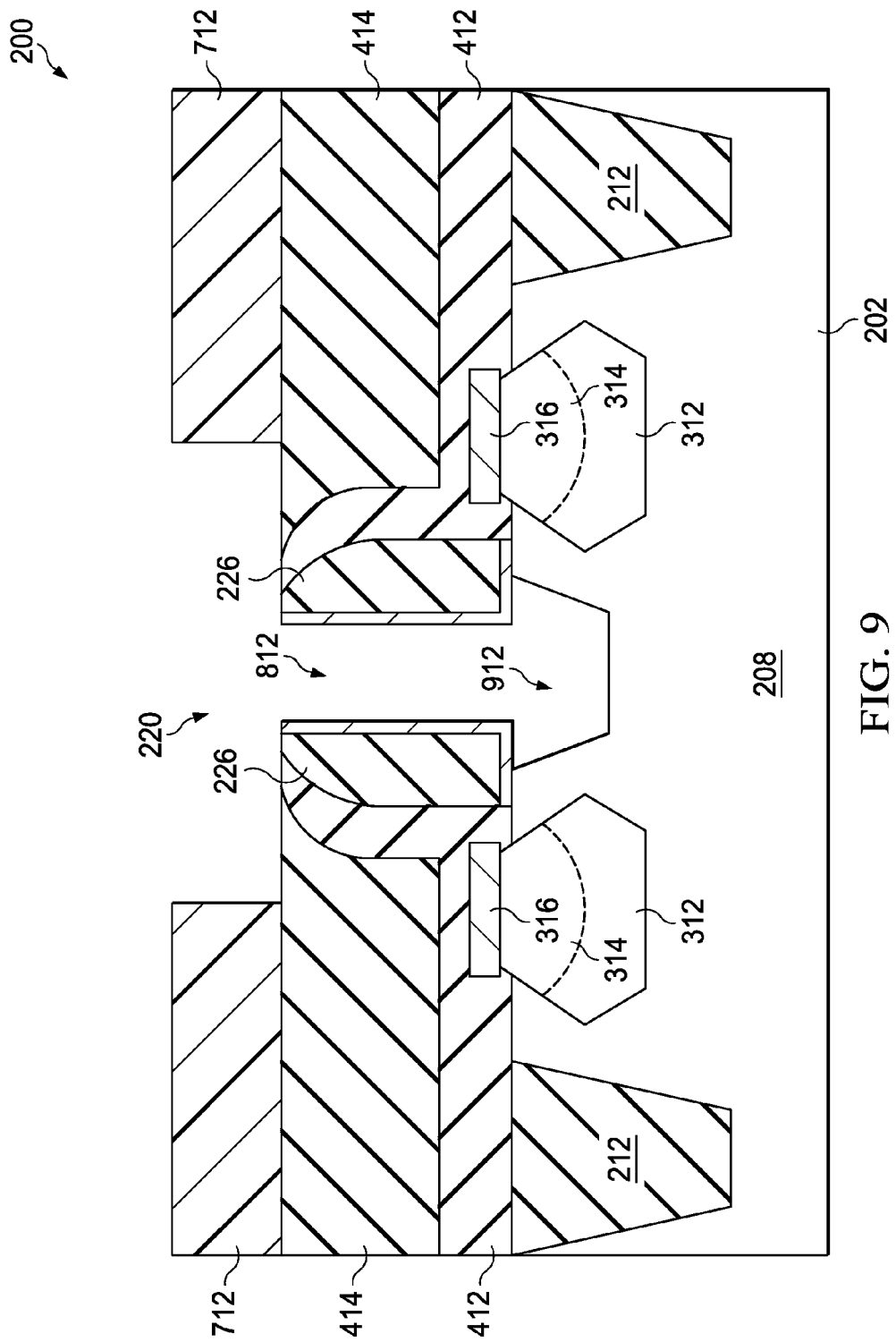

The method 100 (FIG. 1) proceeds to operation 116 to remove a portion of the substrate 202 through the opening 812 thereby forming a recess 912 in the substrate. Referring to FIG. 9, the recess 912 interposes the source/drain regions 312/314/316. In the present embodiment, the recess 912 extends beyond the width of the opening 812 in the channel length direction of the device 200. In the present embodiment, the recess 912 is formed by an etching process that includes a dry etching process, a wet etching process, or a combination thereof. In some embodiments, the etching process of the operation 114 is continued in the operation 116 to form the recess 912, or a portion thereof. In the present embodiment, the etching process is controlled to achieve a desired profile of the recesses 912. In one example, the etching process includes both a dry etching and a wet etching process and etching parameters of the dry and wet etching processes can be tuned (such as etchants used, etching temperature, etching solution concentration, etching pressure, source power, radio frequency (RF) bias voltage, RF bias power, etchant flow rate, and other suitable parameters) to achieve the desired recess profile. After the etching process, a pre-cleaning process may be performed that clean the recesses 912 with a hydrofluoric acid (HF) solution or other suitable solution.

Figure 10:
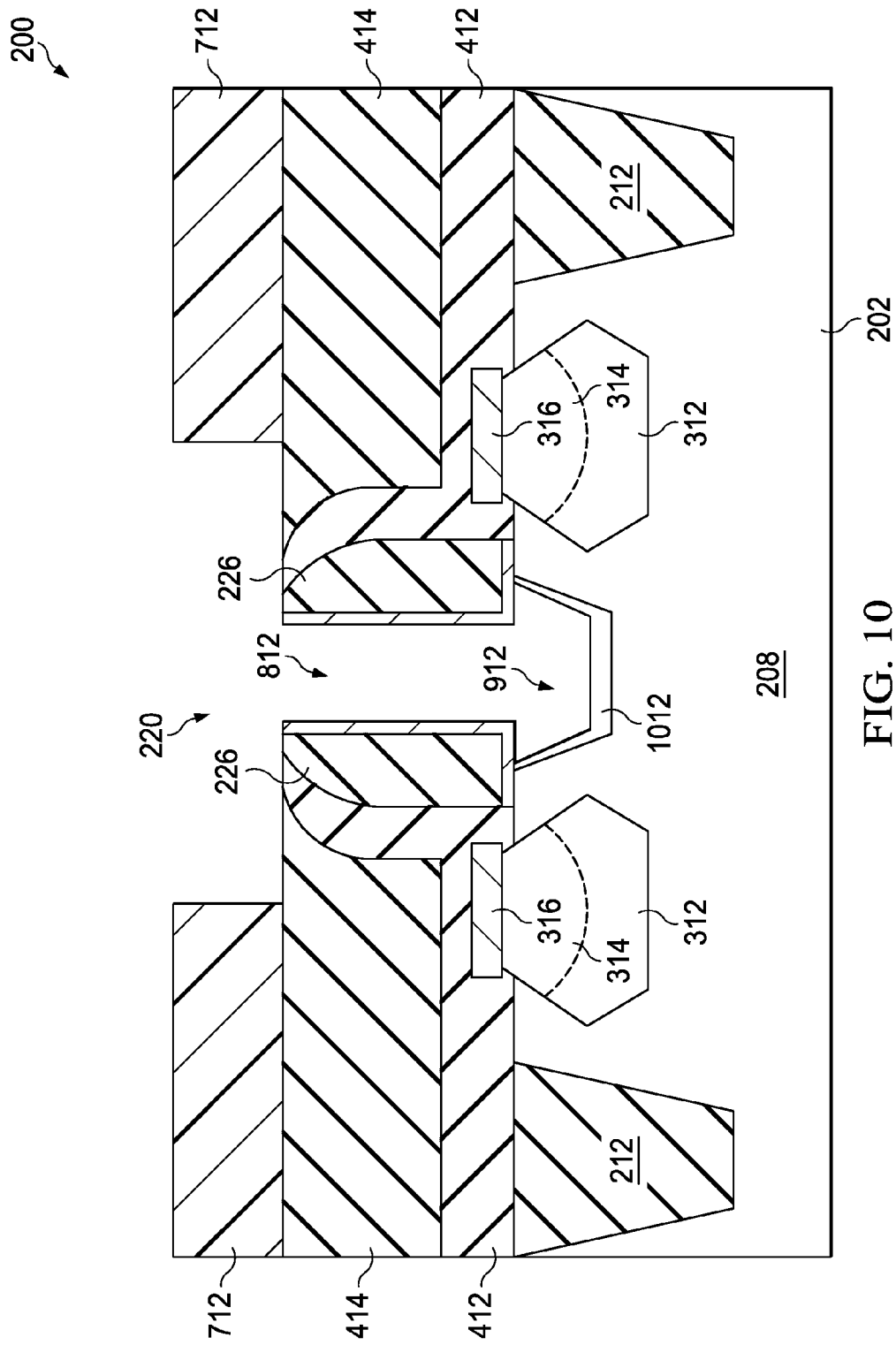

The method 100 (FIG. 1) proceeds to operation 118 to form an impurity diffusion stop layer 1012 in the recess 912. Referring to FIG. 10, in the present embodiment, the impurity diffusion stop layer 1012 is a thin layer of SiC crystal and it covers bottom and sidewalls of the recess 912. For example, the SiC layer 1012 can be formed using an epitaxy process by heating the silicon substrate 202 at a high temperature, such as 700° C., in a hydrogen atmosphere with a gas mixture, such as $SiH_4$, $SiH_2Cl_2$, $SiHCl_3$ or HCl mixed with $SiH_3CH_3$. Alternatively, the SiC layer 1012 can be formed using an ion implantation process and a post-implantation annealing process. In another embodiment, the impurity diffusion stop layer 1012 is a thin layer of SiGe crystal. For example, a layer of SiGe crystal can be formed using an epitaxy process or an ion implantation process.

Figure 11:
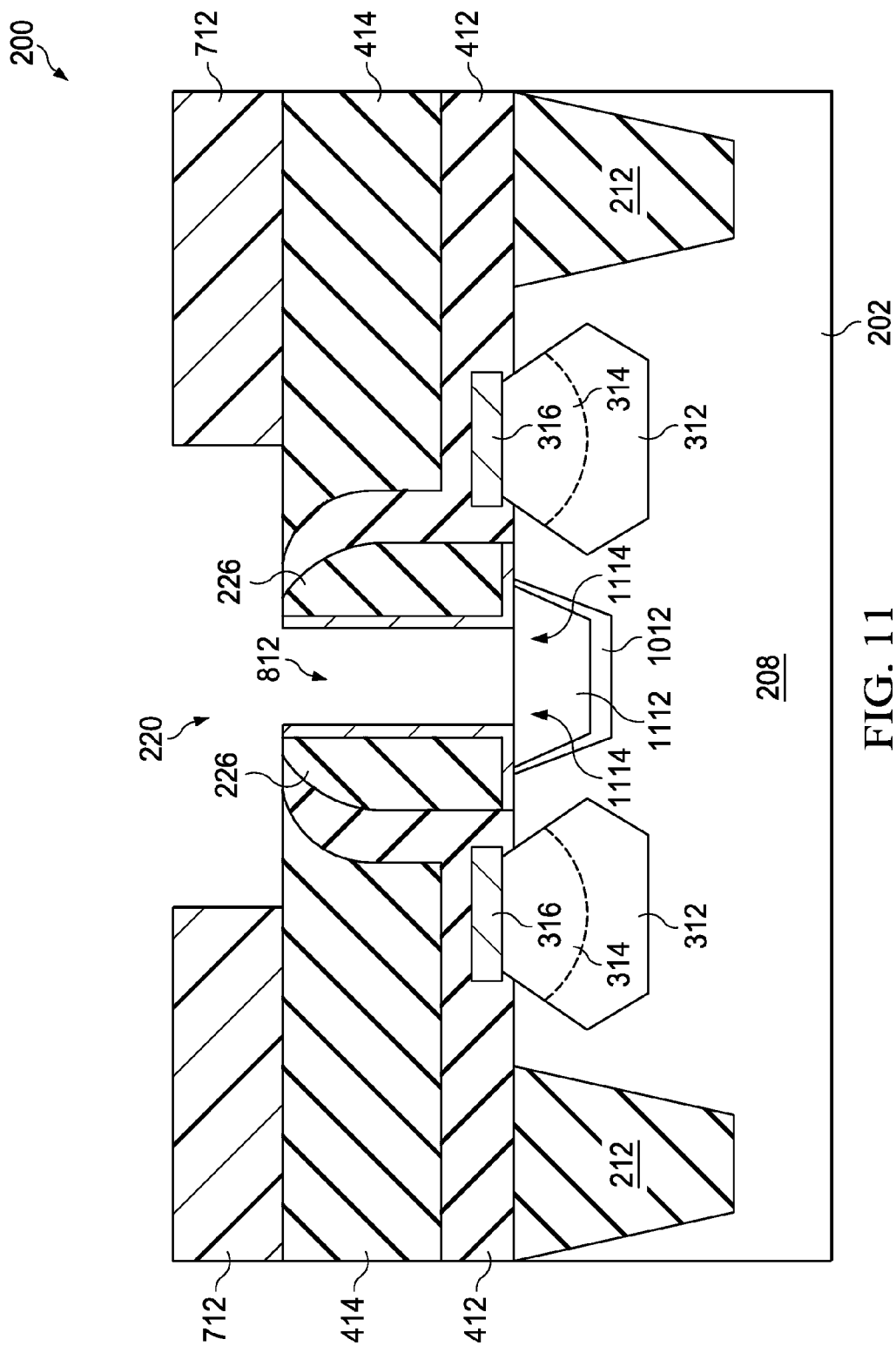

The method 100 (FIG. 1) proceeds to operation 120 to form a non-doped silicon layer 1112 over the impurity diffusion stop layer 1012 in the recess 912. Referring to FIG. 11, the non-doped silicon layer 1112 and the impurity diffusion stop layer 1012 collectively fill the recess 912. In the present embodiment, the non-doped silicon layer 1112 is formed by a selective epitaxial growth (SEG) process. For example, the SEG process is a low pressure chemical vapor deposition (LPCVD) process using silicon-based precursor gases such as silane ($SiH_4$), dicholorosilane (DCS), disilane ($Si_2H_6$), trisilane ($Si_3H_8$), other silicon-based precursor gases, or combinations thereof. A portion of the non-doped silicon layer 1112 forms a new channel region 1114 of the device 200, replacing the channel region 320 (FIG. 2). The non-doped silicon layer 1112 is therefore also referred to as the channel layer 1112. An immediate benefit of the present disclosure is that the channel region 1114 is substantially free from impurities. In contrast, the replaced channel region 320 may have been diffused with impurities during various operations and procedures that form the device 200, such as the source/drain doping processes. In addition, the impurity diffusion stop layer 1012 substantially prevents impurities of the source/drain regions 312/314 and of the doped region 208 from diffusing into the channel layer 1112. Therefore, the dual layer 1012/1112 provides a substantially pure silicon channel for the device 200, greatly improving its carrier mobility and threshold voltage uniformity. In an embodiment where a 20 nm semiconductor process is used in forming the device 200, the SiC layer 1012 is selectively grown to about 3 nm thick and the channel layer 1112 is selectively grown to about 15 nm thick.

Figure 12:
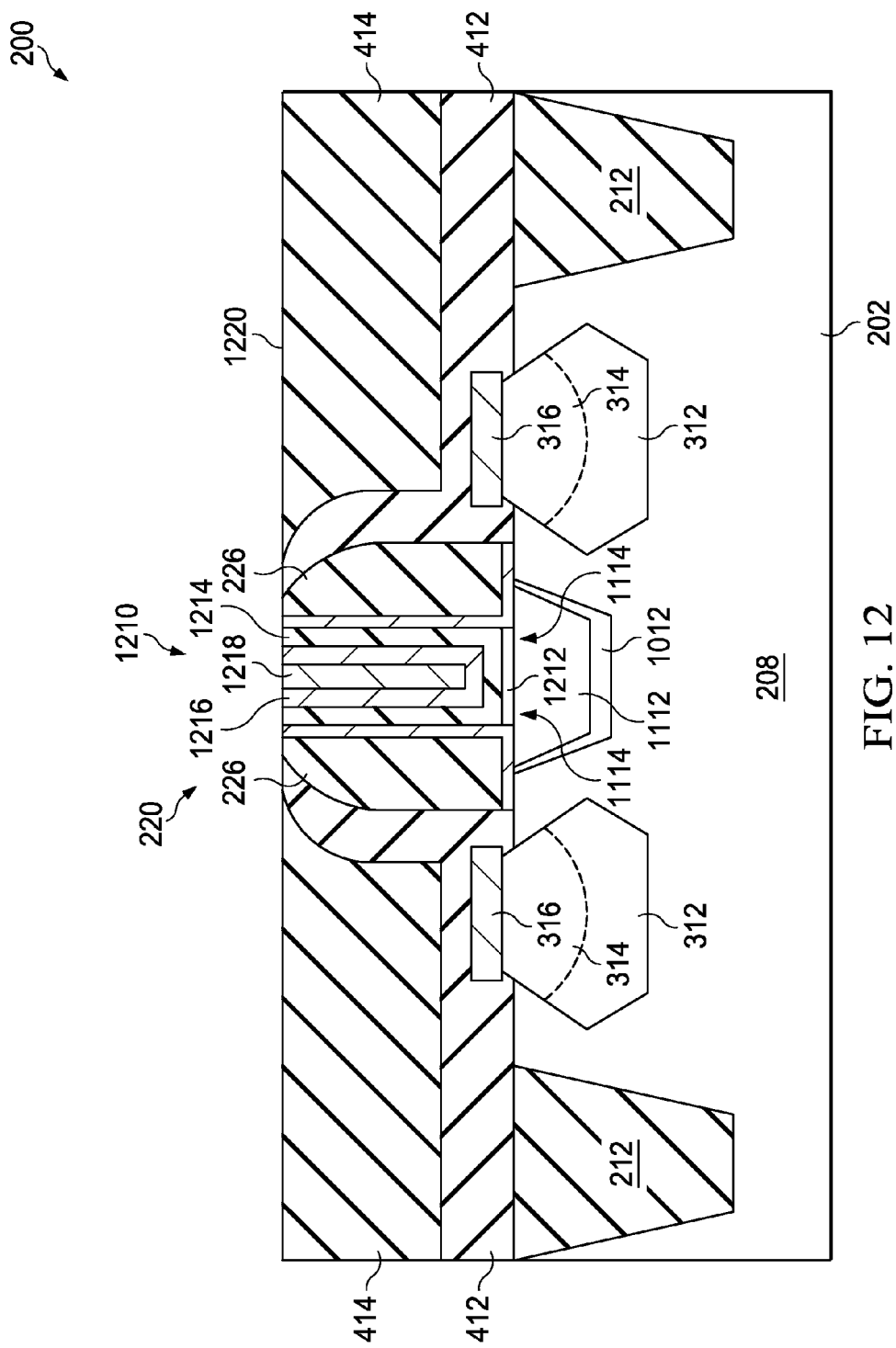

The method 100 (FIG. 1) proceeds to operation 122 to form a gate stack 1210 over the channel region 1114. Referring to FIG. 12, in the present embodiment, the gate stack 1210 includes an interfacial layer 1212, a dielectric layer 1214, a work function metal layer 1216, and a fill layer 1218. The interfacial layer 1212 may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. The dielectric layer 1214 may include a high-k dielectric layer such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material. The dielectric layer 1214 may be formed by ALD and/or other suitable methods. In the present embodiment, the work function metal layer 1216 is a p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. In an embodiment where the device 200 is an NFET, the work function metal layer 1216 is an n-type work function layer. Exemplary n-type work function metals include Ti, Ag, TaAl, TaAlC, TiAlN, TaC, TaCN, TaSiN, Mn, Zr, other suitable n-type work function materials, or combinations thereof. The work function layer 1216 may include a plurality of layers. The work function layer(s) 1216 may be deposited by CVD, PVD, and/or other suitable process. The fill layer 1218 may include aluminum (Al), tungsten (W), or copper (Cu) and/or other suitable materials. The fill layer 1218 may be formed by CVD, PVD, plating, and/or other suitable processes. The gate stack 1210 fills the opening 812 (FIG. 9) of the gate structure 220. A CMP process may be performed to remove excess materials from the gate stack 1210 and to planarize a top surface 1220 of the device 200.

Figure 13:
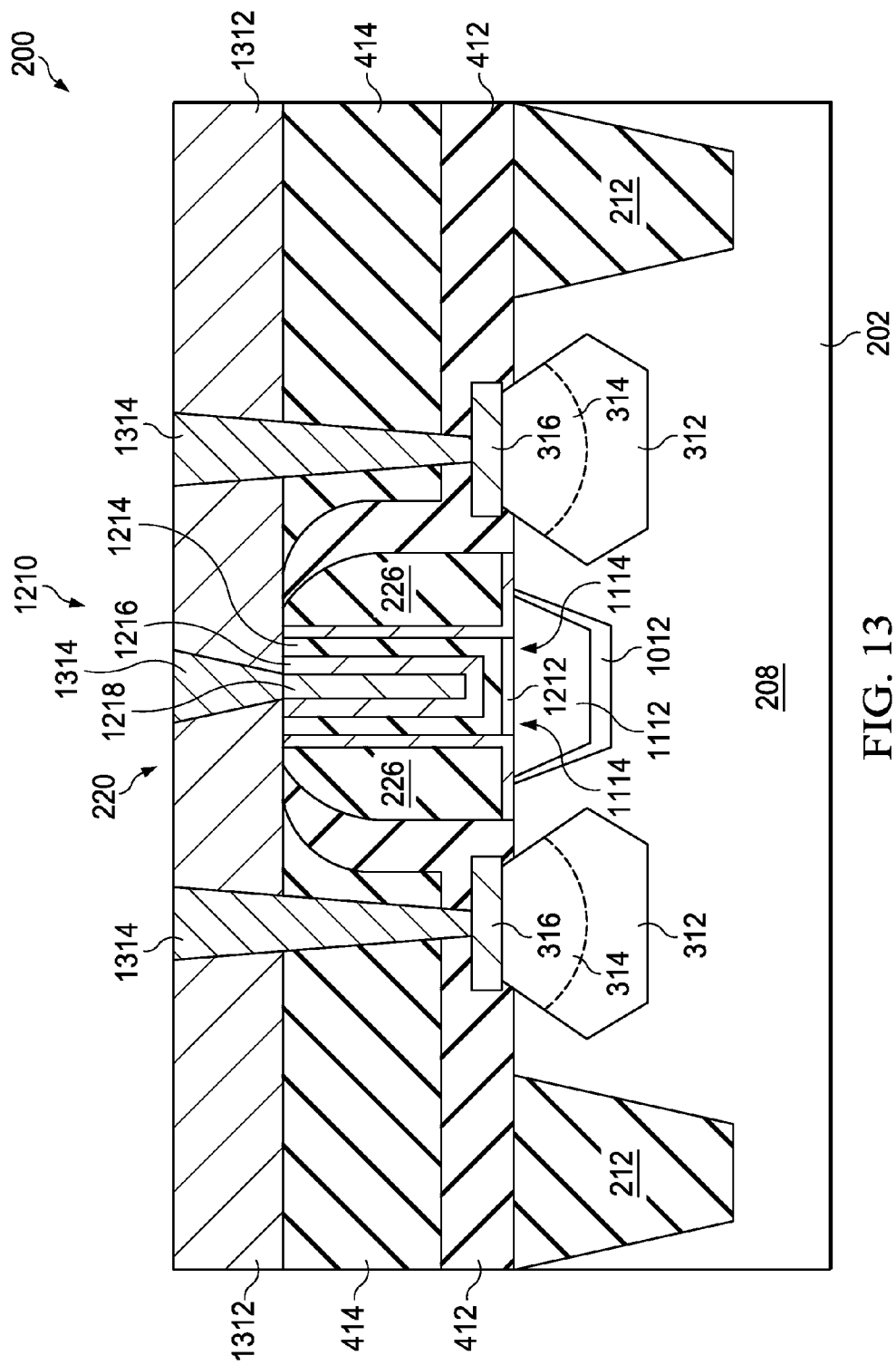

The method 100 (FIG. 1) proceeds to operation 124 to form an inter-layer dielectric (ILD) layer 1312 and contacts 1314. Referring to FIG. 13, in the present embodiment, the ILD layer 1312 may use a material that is the same as or different from that of the dielectric layer 414. The ILD layer 1312 may include dielectric materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1312 may be deposited by a PECVD process or other suitable deposition technique. After the ILD layer 1312 has been formed, the contacts 1314 are formed to provide electrical connection from the source/drain regions 316 and the gate structure 220 to one or more interconnect layers of a multilayer interconnect (MLI). The contacts 1314 may include tungsten or other suitable conductive element. The contacts 1314 may be formed by etching trenches in the ILD layer 1312, the dielectric layer 414, and the CESL 412; and filling the trenches with a conductive material to form vias.

In the above discussion with reference to FIG. 11, the dual layer 1012/1112 is formed after the gate structure 220 (FIG. 2) and the source/drain regions 312/314/316 (FIG. 3) have been formed. In some embodiments of the present disclosure, the dual layer 1012/1112 can be formed before the gate structure 220 (FIG. 2) and the source/drain regions 312/314/316 (FIG. 3) are formed. For example, the substrate 202 can be etched with a hard mask, instead of through the opening 812, thereby forming the recess 912 (FIG. 9). After the dual layer 1012/1112 is formed in the recess 912 (FIG. 11), the gate structure 220 is formed over the channel region 1114 (FIG. 11), and the source/drain regions 312/314/316 are subsequently formed in the substrate adjacent to the channel region 1114.

Although not intended to be limiting, one or more embodiments of the present disclosure provide many benefits to a semiconductor device and the formation thereof. One benefit is that a dual layer is provided for the semiconductor device's channel region. The dual layer includes an impurity diffusion stop layer (e.g., SiC or SiGe) and a substantially pure silicon layer. The impurity diffusion stop layer substantially blocks impurities of the substrate and the doped source/drain regions from diffusing into the silicon layer thereby greatly improving carrier mobility of the semiconductor device in its channel region. Furthermore, the substantially pure silicon layer helps improve threshold voltage (Vt) uniformity among similarly formed semiconductor devices. Both carrier mobility and Vt uniformity are important factors affecting performance of semiconductor devices, particularly in advanced technology nodes, such as 20 nm or smaller. Another benefit is that the dual layer formation includes only few etching and deposition/epitaxy operations. Therefore, it can be integrated with existing processes, such as a gate-last high-k metal gate formation process.

In one exemplary aspect, the present disclosure is directed to a method of forming a semiconductor device. The method includes etching a substrate thereby forming a recess in the substrate, and forming an impurity diffusion stop layer in the recess, wherein the impurity diffusion stop layer covers bottom and sidewalls of the recess. The method further includes forming a channel layer over the impurity diffusion stop layer, and forming a gate stack over the channel layer.

In another exemplary aspect, the present disclosure is directed to a method of forming a semiconductor device. The method includes forming a gate structure over a substrate, the gate structure having a dummy interfacial layer. The method further includes forming a source region and a drain region in the substrate adjacent to the gate structure; removing at least the dummy interfacial layer thereby forming an opening in the gate structure; etching the substrate through the opening thereby forming a recess in the substrate; forming an impurity diffusion stop layer in the recess, the impurity diffusion stop layer covering bottom and sidewalls of the recess; forming a channel layer over the impurity diffusion stop layer; and forming a gate stack over the channel layer in the opening.

In another exemplary aspect, the present disclosure is directed to a semiconductor device. The semiconductor device includes a substrate, and a source region and a drain region formed in the substrate. The semiconductor device further includes an impurity diffusion stop layer formed in a recess of the substrate between the source region and the drain region, wherein the impurity diffusion stop layer covers bottom and sidewalls of the recess. The semiconductor device further includes a channel layer formed over the impurity diffusion stop layer and in the recess, and a gate stack formed over the channel layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   etching a substrate thereby forming a recess in the substrate;
   forming an impurity diffusion stop layer in the recess, the impurity diffusion stop layer covering a bottom and sidewalls of the recess;
   forming a channel layer over the impurity diffusion stop layer; and
   forming a gate stack over the channel layer.

2. The method of claim 1, further comprising, before etching the substrate:
   forming a gate structure over the substrate, the gate structure having a dummy layer;
   forming a source region and a drain region in the substrate adjacent to the gate structure; and
   removing at least the dummy layer thereby forming an opening in the gate structure, wherein the etching the substrate is performed through the opening.

3. The method of claim 1, further comprising:
   forming a source region and a drain region in the substrate adjacent to the gate stack.

4. The method of claim 1, wherein the impurity diffusion stop layer is a SiC layer formed by an implantation process.

5. The method of claim 1, wherein the impurity diffusion stop layer is a SiC layer formed by an epitaxy process.

6. The method of claim 1, wherein the channel layer is a silicon crystal formed by an epitaxy process.

7. The method of claim 1, wherein the forming the gate stack includes:
   forming an interfacial layer over the channel layer;
   forming a high-k dielectric layer over the interfacial layer; and
   forming a metal layer over the high-k dielectric layer.

8. The method of claim 1, wherein the etching the substrate includes a dry etching process and a wet etching process.

9. A method of forming a semiconductor device, comprising:
   forming a gate structure over a substrate, the gate structure having a dummy interfacial layer;
   forming a source region and a drain region in the substrate adjacent to the gate structure;
   removing at least the dummy interfacial layer thereby forming an opening in the gate structure;
   etching the substrate through the opening thereby forming a recess in the substrate;
   forming an impurity diffusion stop layer in the recess, the impurity diffusion stop layer covering bottom and sidewalls of the recess;
   forming a channel layer over the impurity diffusion stop layer; and
   forming a gate stack over the channel layer in the opening.

10. The method of claim 9, wherein:
    the impurity diffusion stop layer is a SiC layer or a SiGe layer formed by an epitaxy process; and
    the channel layer is a silicon layer formed by an epitaxy process.

11. The method of claim 9, wherein the forming the source and drain regions includes an epitaxy process.

12. The method of claim 9, wherein the forming the source and drain regions includes an ion implantation process.

13. The method of claim 9, wherein the gate structure includes a dummy poly layer over the dummy interfacial layer, further comprising, before the removing at least the dummy interfacial layer:
    removing the dummy poly layer; and
    forming a masking layer over the gate structure and over the substrate, wherein the masking layer includes another opening through which the dummy interfacial layer can be removed.

14. The method of claim 9, wherein the etching the substrate uses an etch bias so as to extend the recess beyond the opening in a channel length direction of the semiconductor device.

15. A semiconductor device, comprising:
    a substrate;
    a source region and a drain region formed in the substrate;
    an impurity diffusion stop layer formed in a recess of the substrate between the source region and the drain region, the impurity diffusion stop layer covering bottom and sidewalls of the recess;
    a channel layer formed over the impurity diffusion stop layer and in the recess; and
    a gate stack formed over the channel layer.

16. The semiconductor device of claim 15, wherein both the source and drain regions include a heavily doped source/drain (HDD) region and a lightly doped source/drain (LDD) region.

17. The semiconductor device of claim 15, wherein:
    the substrate is a silicon substrate;
    the source and drain regions include a p-type impurity;
    the channel layer includes a silicon crystal; and
    the impurity diffusion stop layer includes a SiC crystal or a SiGe crystal.

18. The semiconductor device of claim 17, wherein:
    the silicon crystal is an epitaxially grown crystal; and
    the impurity diffusion stop layer is an epitaxially grown SiC crystal.

19. The semiconductor device of claim 17, wherein both the source and drain regions include epitaxially grown silicon crystal with the p-type impurity.

20. The semiconductor device of claim 15, wherein the gate stack includes an interfacial layer over the channel region, a high-k dielectric layer over the interfacial layer, and a metal layer over the high-k dielectric layer.

* * * * *